(12) United States Patent
Nelson et al.

(10) Patent No.: US 8,808,646 B2
(45) Date of Patent: Aug. 19, 2014

(54) WIRELESS TRANSMISSION OF PROCESS DATA FROM WITHIN PRESSURE VESSELS

(75) Inventors: Karl M. Nelson, Issaquah, WA (US); Anoshiravan Poursartip, Vancouver (CA)

(73) Assignee: The Boeing Company, Chicago, IL (US)

(*) Notice: Subject to any disclaimer, the term of this patent is extended or adjusted under 35 U.S.C. 154(b) by 573 days.

(21) Appl. No.: 12/041,832

(22) Filed: Mar. 4, 2008

(65) Prior Publication Data

US 2009/0225517 A1 Sep. 10, 2009

(51) Int. Cl.
*B01L 3/14* (2006.01)

(52) U.S. Cl.
USPC ............ 422/550; 422/547; 422/560; 422/565

(58) Field of Classification Search
None
See application file for complete search history.

(56) References Cited

U.S. PATENT DOCUMENTS

| | | | | |
|---|---|---|---|---|
| 3,007,596 A | * | 11/1961 | Matsch | 220/560.13 |
| 3,265,893 A | * | 8/1966 | Rabson et al. | 250/261 |
| 5,426,428 A | * | 6/1995 | Binder et al. | 340/870.17 |
| 6,708,502 B1 | * | 3/2004 | Aceves et al. | 62/45.1 |
| 7,369,411 B2 | * | 5/2008 | Hill et al. | 361/708 |
| 7,440,283 B1 | * | 10/2008 | Rafie | 361/709 |
| 7,712,662 B2 | * | 5/2010 | Rock | 235/439 |
| 2006/0123914 A1 | | 6/2006 | Pena et al. | |
| 2006/0145840 A1 | * | 7/2006 | Klun | 340/539.22 |
| 2007/0012429 A1 | * | 1/2007 | Siu | 165/104.33 |
| 2007/0202004 A1 | | 8/2007 | Martel et al. | |
| 2008/0176753 A1 | | 7/2008 | Clothier | |

FOREIGN PATENT DOCUMENTS

| | | |
|---|---|---|
| DE | 2720118 A * | 11/1978 |
| EP | 0 604387 A1 | 12/1993 |
| EP | 1 662234 A1 | 5/2006 |
| WO | WO 93/21964 | 11/1993 |

OTHER PUBLICATIONS

Machine translation of DE-2720118-A.*
www.intersema.ch/site/technical/products_guide.php#smd.
www.microstrain.com/wireless-sensors.aspx.

* cited by examiner

*Primary Examiner* — Jill Warden
*Assistant Examiner* — Dwayne K Handy
(74) *Attorney, Agent, or Firm* — Parsons Behle & Latimer (57) ABSTRACT

A system collects data relating to a process performed within an autoclave, and wirelessly transmits the data to a receiver located outside the autoclave for processing. One or more sensors inside the autoclave sense process parameters such as temperature or pressure. The transmitter is housed in a protective container that protects the transmitter against the effects of autoclave heat and pressure.

17 Claims, 6 Drawing Sheets

WIRELESS TRANSMISSION OF PROCESS DATA FROM WITHIN PRESSURE VESSELS

TECHNICAL FIELD

This disclosure generally relates to techniques for collecting industrial process data using telemetry, and deals more particularly with a system and method for wirelessly transmitting process data from within a pressure vessel, such as an autoclave.

BACKGROUND

It is often desirable to measure certain industrial process parameters such as temperature, pressure or the state of a process reaction in order to optimize the process. For example, laminated composite layups may be placed in an autoclave in order to compact and cure the layup at elevated temperatures and pressures. It is sometimes desirable to measure the pressure that is applied at various locations over the layup since these local pressures may have an affect on the porosity, and thus the quality, of the cured composite part.

Collecting process data of the type mentioned above is more difficult where the process is carried out under hostile environmental conditions, such as at elevated temperature and pressure levels commonly used in autoclaves, due to the sensitivity of the electronic measuring devices to elevated temperature and pressure. Currently, in order to measure parameters such as the pressure applied to a layup, and temperature, pressure sensors and thermocouples placed on or near the layup are connected by long lines that must be placed and carefully arranged inside the autoclave. In the case of vacuum or pressure sensing, a relatively cumbersome, heavy hose must be used to connect the layup with a junction box on the autoclave wall. These lines and hoses must be individually connected to fittings in the junction box in order to couple the measuring devices to electronic data collection equipment outside of the autoclave. Coupling the measuring devices to data logging equipment located outside of the autoclave requires multiple wiring penetrations through the autoclave wall.

The procedure described above has a number of disadvantages, including the time and labor needed to plan, arrange, orient and hookup the lines and hoses inside the autoclave. The wires and hoses are relatively costly, and provide little or no flexibility in design layout. Moreover, the measurement sensors cannot provide useful data until they are hooked up to the autoclave, thus precluding the possibility of making preliminary measurements before the layup is loaded into the autoclave. Similarly, the measurement sensors cannot provide useful data after they are unhooked and the layup has been removed from the autoclave to undergo cooling.

Accordingly, there is a need for a system for measuring and transmitting process data from inside an autoclave that is economical, easy to setup and eliminates cumbersome connecting wires and hoses. Further, there is a need for a system of the type mentioned above that is highly flexible and allows measurement of at least some parameters before a part layup is loaded into the autoclave and/or after the part layup has been removed from the autoclave.

SUMMARY

The disclosed embodiments provide for in-situ monitoring of autoclave processes. One advantage of the disclosed embodiments is that a system is provided for in-situ process monitoring that largely eliminates the need for long and cumbersome lengths of hoses and connecting wires in order to connect data collection equipment with measuring sensors on or near a part layup. Connecting wires and hoses are essentially eliminated through use of a wireless transmitter that transmits the measurement data from the part layup to data collection/processing equipment located outside of the autoclave. Only a single wiring penetration of the autoclave wall is necessary in order to hook-up external data logging equipment with sensors inside the autoclave.

According to one disclosed embodiment, a container is provided for protecting a wireless transmitter used to transmit data from a high temperature, high pressure environment. The container comprises a pressure tight housing for protecting the transmitter from the effects of pressure in the high temperature, high pressure environment; a compartment inside the housing within which the transmitter may be placed; and, a thermal barrier within the housing which surrounds the compartment and protects the transmitter from the effects of heat in the high temperature, high pressure environment. The thermal barrier may include a volume of thermal insulation and a heat sink surrounding the transmitter compartment in order to prevent the temperature in the compartment from reaching a level that may damage the transmitter. The heat sink may include a thermal mass such as iron, water or a phase change metal alloy having a relatively low melting point.

According to another disclosed embodiment, a container is provided for protecting an electronic device against the effects of external heat and pressure, comprising: an outer, pressure tight housing; a compartment within which the electronic device may be contained; a vacuum chamber surrounding the inner compartment in which air is partially evacuated to thermally insulate the compartment; and, a heat sink for absorbing heat passing through the vacuum chamber, the heat sink surrounding the compartment and being disposed between the compartment and the vacuum chamber. The heat sink may include a reservoir adapted to contain a quantity of water. A passageway places the reservoir in fluid communication with the vacuum, and a fluid connection on the housing is adapted to be connected with a source of reduced pressure for drawing off water vapor in the vacuum chamber. The heat sink may include a phase change metal alloy containing Bi, Pb, and In. The container may further include an antenna adapted to be connected to the transmitter and mounted on an exterior surface of the pressure tight housing.

According to a further disclosed embodiment, a system is provided for collecting data relating to a process performed within an autoclave, comprising: at least one sensor inside the autoclave for sensing a parameter related to the process; a wireless transmitter connected to the sensor for transmitting signals from inside the autoclave representing the sensed parameter; a container disposed inside the autoclave, the container surrounding and protecting the transmitter against the effects of heat and pressure inside the autoclave; and, a wireless receiver outside of the autoclave and including an antenna inside the autoclave for receiving the transmitted signals. The container may include a pressure tight housing, a compartment in which the transmitter is disposed, a layer of thermal insulation surrounding the compartment and a heat sink surrounding the compartment and disposed between the layer of thermal insulation and the compartment. The receiver includes wiring passing through the autoclave for connecting the receiving antenna to the receiver unit. The system may optionally include a data logger inside the container for logging and storing the sensed parameters for later download. The container may be received within a cavity formed in a tool used in the process.

According to a disclosed method embodiment, collecting data from a process carried out inside an autoclave, comprises: sensing process data inside the autoclave; sending the sensed data to a wireless transmitter inside the autoclave; and, wirelessly transmitting the data; and, receiving the transmitted data at a receiver located outside the autoclave. The method may further comprise protecting the wireless transmitter against the effects of heat and pressure within the autoclave. Protecting the wireless transmitter may include placing the wireless transmitter in a pressure tight compartment, and surrounding the compartment with a thermal barrier. Wirelessly transmitting the data may include wirelessly transmitting the data between first and second antennas inside the autoclave, and delivering the data from the second antenna through a wall of the autoclave to the receiver.

Embodiments of the disclosure satisfy the need for a system for measuring or monitoring process parameters at elevated temperature and pressure, which is rapid, economical and flexible.

Other features, benefits and advantages of the disclosed embodiments will become apparent from the following description of embodiments, when viewed in accordance with the attached drawings and appended claims

BRIEF DESCRIPTION OF THE ILLUSTRATIONS

DETAILED DESCRIPTION

Figure 1:
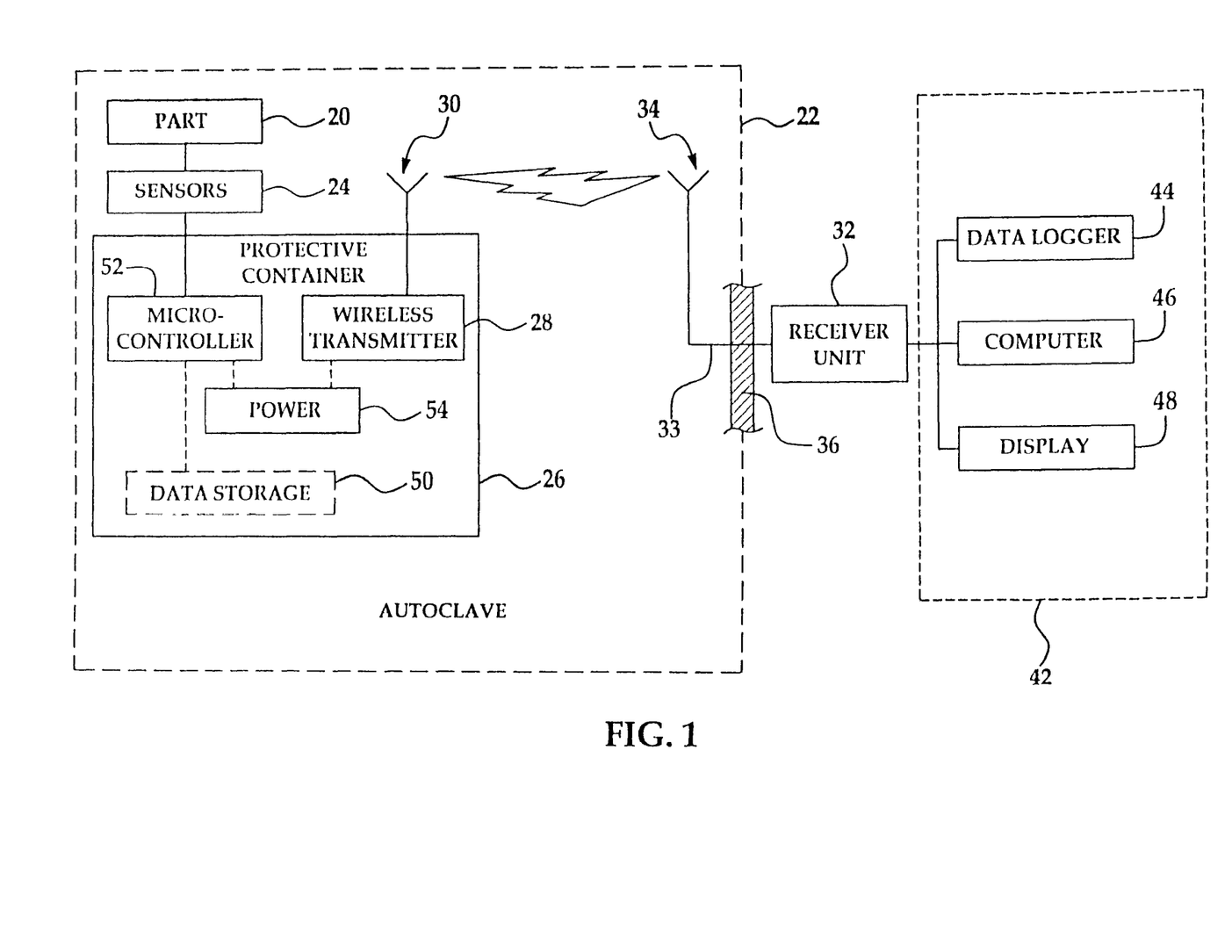
FIG. 1 is a block diagram of a system for measuring and wirelessly transmitting process data from within an autoclave.

Referring first to FIG. 1, a process may be carried out on a part 20 disposed within an autoclave 22 or similar vessel where the part 20 is subjected to elevated pressure and/or temperature. Sensors 24 may be used to sense the temperature, pressure or other parameters such as for example and without limitation, dielectric properties or process reactions, at or near the part 20. For example, pressure sensors 24 may be used to sense the pressure applied by the autoclave 22 to various areas of the part 20 in order to assess the areal uniformity of the applied pressure which may effect, for example and without limitation, the porosity of the finished part 20. The parameters measured by sensors 24 are delivered as data to a wireless transmitter 28 which is protectively enclosed within a container 26 that will be described later in more detail. The wireless transmitter 28 is disposed inside the autoclave 22 and may comprise a conventional RF transmitter that wirelessly transmits the data from a transmitting antenna 30 outside of the container 26. Other types of wireless technology may be employed such as, for example, without limitation, infrared transmission.

The sensor-read data is transmitted from the transmitting antenna 30 to a receiving antenna 34 which is also located inside of the autoclave 22. The receiving antenna 34 is connected to a receiver unit 32 located outside of the autoclave 22 by suitable wiring 33 that passes through a wall 36 of the autoclave 22. The receiver unit 32 may be connected with a data collection/processing system 42 that collects and processes the transmitted sensor data. For example, the data collection/processing system 42 may include one or more of a data logger 44, computer 46 and/or a display 43 which displays the data for operator observation/use.

In an alternate embodiment, it is possible to store the sensor-read data in a data storage unit 50 located within the container 26 for later download and use. A microcontroller 52 may be used to manage the data collection, the data storage 50, and the subsequent download of the data. A power source 54 may comprise a suitable DC source of power which is used to power the wireless transmitter 28 and the microcontroller 52. However, in some embodiments, it may be possible to employ an external source of AC power (not shown) which, using suitable conversion circuitry (not shown), is converted to DC power used to power the transmitter 28 and microcontroller 52.

Figure 2:
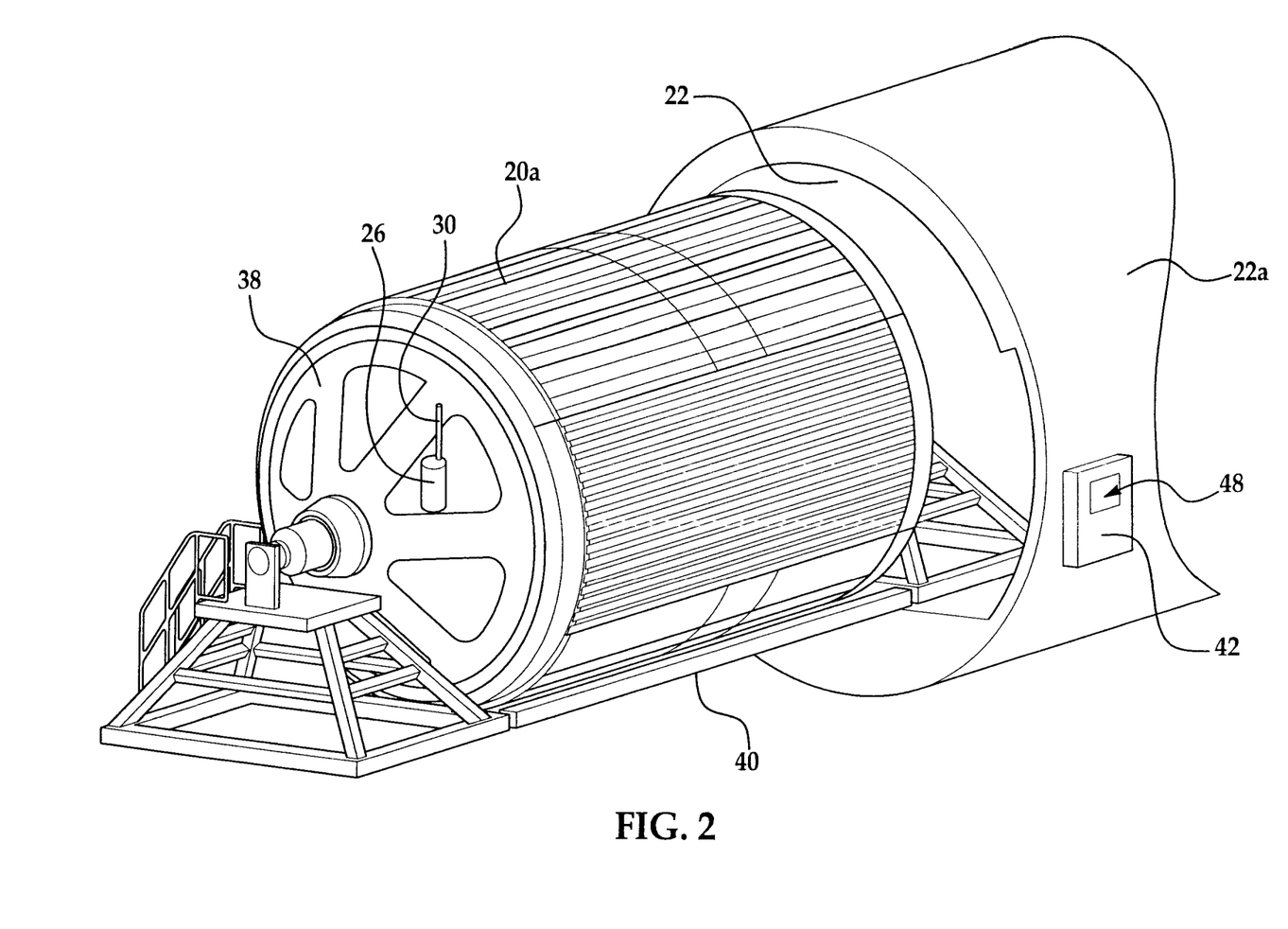
FIG. 2 is a perspective view illustrating a typical part layup being loaded into an autoclave, and showing the position of an enclosed, wireless transmitter.

FIG. 2 illustrates a large part 20a comprising a laminated composite layup formed on a cylindrical mandrel tool 38 which is supported on a portable tool cart 40. The tool cart 40 allows the part 20a to be rolled into the interior of the autoclave 20 where the part 20a is subjected to elevated temperature and pressure in order to cure and compact the part 20a. The protective container 26 may be permanently or removably attached to the mandrel tool 38 so as to be proximity to the part 20a. This proximity to the part 20a minimizes the length of wiring that is required to connect the sensors 24 to the transmitter 28 inside the container 26. The container 26 may also be mounted on the tool cart 40 or, as will be described later in more detail, the container 26 may be placed in a cavity (not shown) within the mandrel tool 38 or other tool feature, depending upon the geometry of the part 20a and related tooling. The data collection/processing system 42 is shown as being mounted on the outside wall 22a of the autoclave 22, however it may also be mounted remotely from the autoclave 22, if desired.

Referring now also to FIGS. 3-6, one embodiment of the protective container 26 includes a rigid outer, pressure tight housing 55 which may comprise for example, without limitation, a formed metal or composite material structure capable of withstanding the operating pressures used in the autoclave 22. An electrical receptacle 64 may be provided on one end of the housing 55 to facilitate electrically connecting the transmitter 28 with lead wires 62 from the sensors 24. The receptacle 64 and lead wires 62 may take the form of the common male and female electrical socket and plug. The transmitting antenna 30 may be mounted at any suitable location on the exterior surface of the housing 55.

Figure 3:
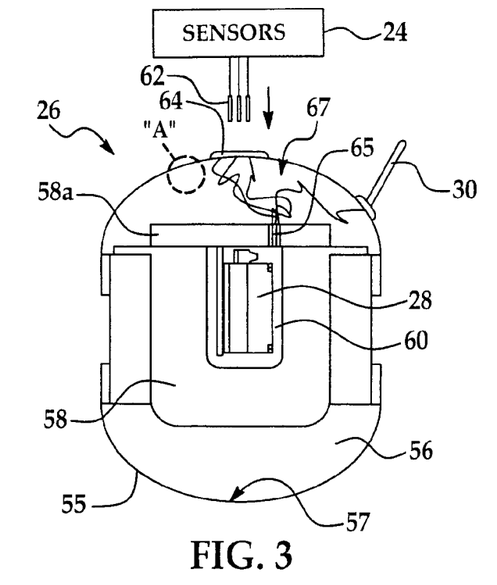
FIG. 3 is a cross sectional view of one embodiment of a container for protecting the transmitter.
Figure 4:
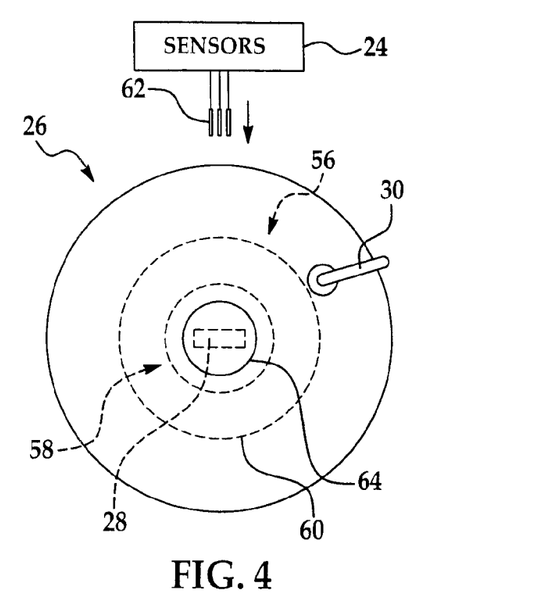
FIG. 4 is a top view of the container shown in FIG. 3.
Figure 5:
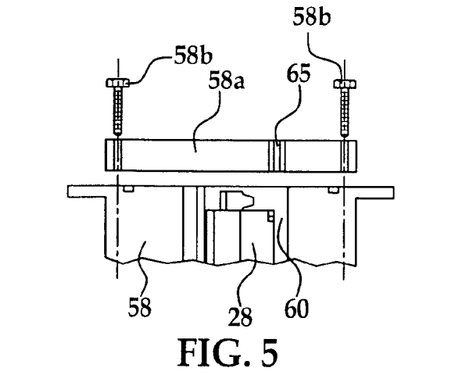
FIG. 5 is an enlarged, exploded sectional view of a portion of the heat sink and transmitter compartment of the container shown in FIG. 3.

The transmitter 28 is disposed within a central, cylindrically shaped compartment 60 inside the housing 55 which is maintained substantially at atmospheric pressure of about 14.7 PSI. Compartment 60 is surrounded by a heat sink 58 which may comprise, for example, without limitation, a large thermal mass such as iron. As best seen in FIG. 5, the heat sink 58 may include a flat plate 58a covering the transmitter compartment 60 which is removably secured to the heat sink 58 by screws 58b. An air tight pass-through plug 65 in plate 58a allows sensor and antenna wires 67 to pass through into the transmitter compartment 60.

The heat sink 58 is spaced from the interior wall 57 of the housing 55 to define a vacuum chamber 56 which surrounds the heat sink 58. The vacuum chamber 56 is fluidly isolated from the compartment 60 such that the vacuum chamber may be maintained at or below atmospheric pressure and the compartment at atmospheric pressure while processes involving elevated temperature and pressure are carried out within the autoclave 22. The vacuum chamber 56 functions to thermally insulate compartment 60 against elevated temperatures within the autoclave 22. The heat sink 58 functions: to absorb any heat passing through the vacuum chamber 56 so as to maintain the temperature within compartment 60 below a level that may cause damage to the electronics used in the transmitter 28.

Figure 6:
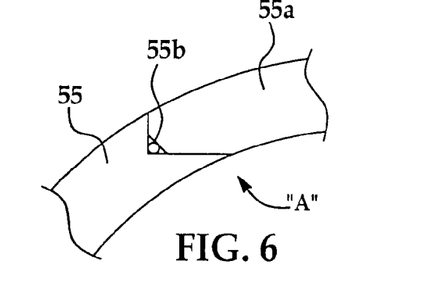
FIG. 6 is an enlarged view of the area designated as "A" in FIG. 3.
Figure 6A:
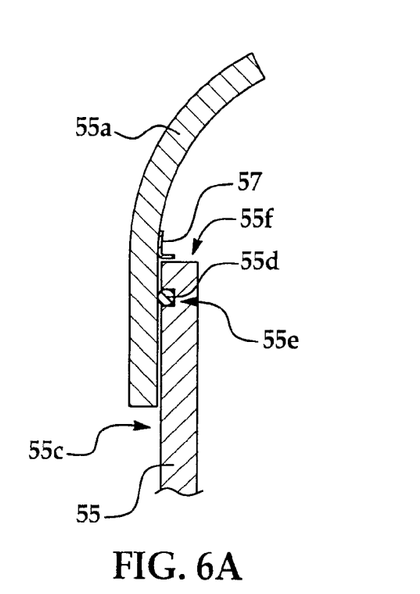
FIG. 6a is a view similar to FIG. 6, but showing an alternate form of the container lid.

In the illustrated example, the housing 55, vacuum chamber 56, heat sink 58 and compartment 60 are all generally cylindrical in shape, have a circular cross section and concentrically surround the compartment 60, however other geometries are possible. As shown in FIG. 6, access to the transmitter compartment 60 may be gained through a lid 55a forming part of the housing 55. The lid 55a may be sealed against the housing 55 using an O-ring 55b. Fasteners (not shown) may be used to hold the lid 55a against the housing 55, however in some applications, the elevated pressure within the autoclave 22 may be sufficient to hold the lid 55a against the housing 55 and maintain a vacuum tight seal. FIG. 6a illustrates an alternative container construction in which the lid 55a overlaps the housing 55 and is sealed to the outside wall 55c of the housing 55 by an O-ring 55d retained within a notch 55e in wall 55c. A shoulder 57 on the lid 55a acts as a stop that engages the upper edge 55f of the housing 55. As previously indicated, no fasteners may be needed because the autoclave pressure forces the lid 55a down onto the housing 55.

The vacuum chamber 56 together with the heat sink 58 form a thermal barrier which controls the environment within the compartment 60 in order to protect the transmitter 28. It should be noted here that although an air tight vacuum chamber 56 has been disclosed in connection with the present embodiments, it may be possible to fill the vacuum chamber 56 with common forms of insulating materials, such as insulating foams in order to achieve the desired level of thermal insulation.

The dimensions of the container 26 as well as the material used therein to achieve an environmentally controlled transmitter compartment 60 will depend upon the particular application, and especially the maximum pressures and temperatures generated within the autoclave 22. In one typical application, however, the container 26 may be designed to maintain an environment within the transmitter compartment 60 that does not exceed 120° F. and one atmosphere of pressure for an eight hour period. The container 26 may be effective in maintaining this compartment environment in autoclave pressures up to 100-psig and temperatures up to 365° F.

Figure 7:
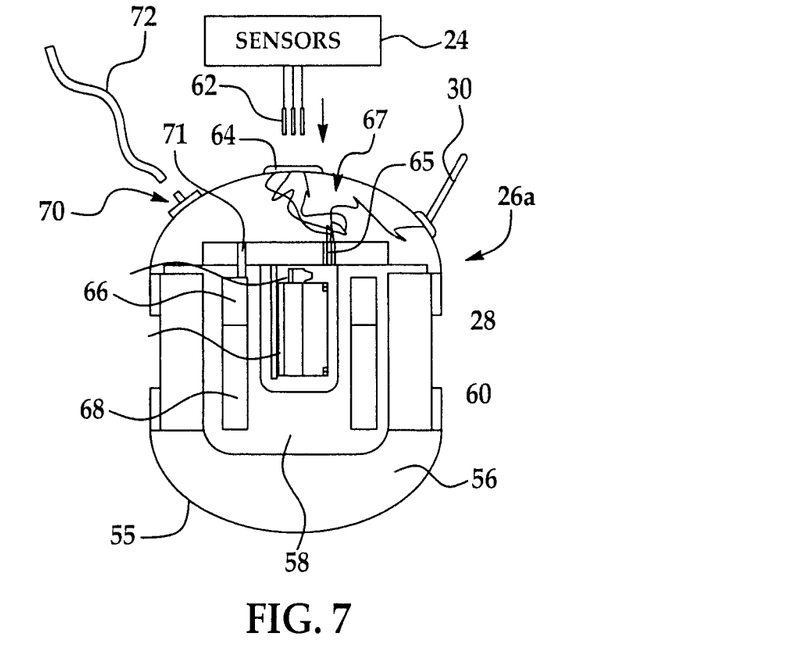
FIG. 7 is a view similar to FIG. 3 but showing an alternate embodiment of the container.

Attention is now directed to FIG. 7 in which an alternate embodiment 26a of the container 26 is illustrated. In this embodiment, the heat sink 58 is provided with a ring shaped inner reservoir 66 that is filled with a suitable phase change Liquid, such as water 68. The reservoir 66 is connected to the vacuum chamber 56 through an opening 71 in the heat sink 58. Thus, the pressure in the reservoir 66 is essentially the same as that within the vacuum chamber 56. Since the water 68 is subjected to a partial vacuum, it boils at a lower temperature, e.g. 120° F., resulting in the absorption of heat that provides active cooling that maintains the temperature compartment 60 substantially in an isothermal condition. Boiling of the water 68 may result in some water vapor being created which may reduce the vacuum within chamber 56. Accordingly, a vacuum hose 72 may be connected to the vacuum chamber 56 through a hose fitting 70. Water vapor in the reservoir 66 and chamber 56 are drawn off through the hose 72 in order to maintain the requisite level of vacuum in chamber 56.

Figure 8:
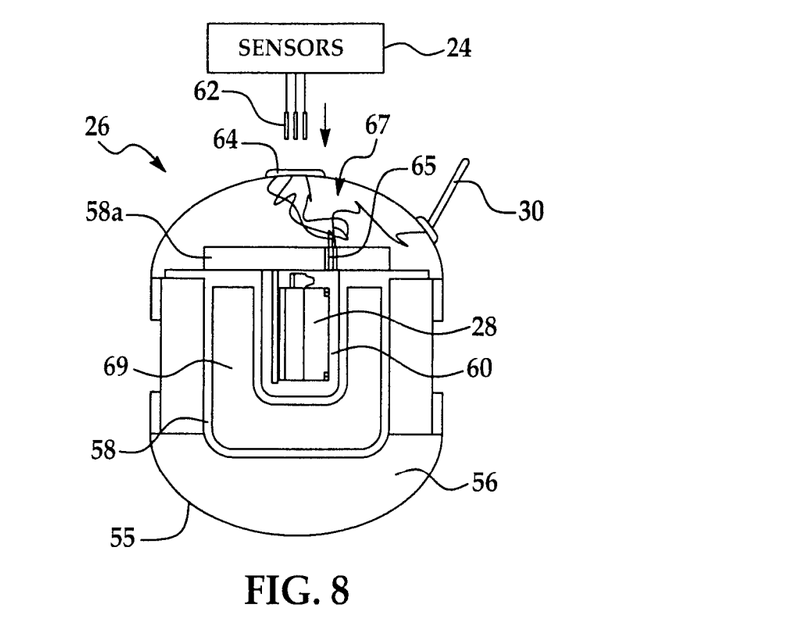
FIG. 8 is a view similar to FIG. 3 but showing another embodiment of the container.

FIG. 8 illustrates a further container embodiment 26b in which the heat sink 58 includes a volume 69 of a heat sink material comprising a low melting point alloy, which aids in maintaining isothermal conditions in the transmitter compartment 60, by virtue of the heat of fusion of the metal alloy. One suitable metal alloy having a low melting point may comprise, by percentage mass: 44.7% Bi, 22.6% Pb, 19.1% In, 8.3% Sn and 5.3% Cd. This alloy has a melting point of approximately 117° F., a density of 9.16 g/cc, a heat capacity of 0.163 J/g.C, and a heat of fusion of 36.8 J/g. Other low melting point alloys may be possible depending upon the isothermal conditions that are required for the transmitter compartment 60 in a particular application.

Figure 9:
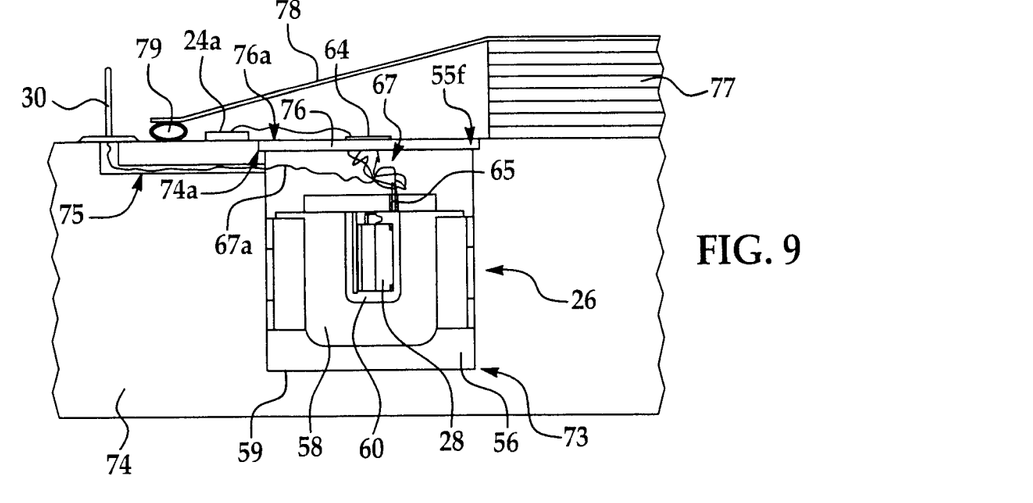
FIG. 9 is a sectional view showing the container within a cavity in a tool base, a vacuum bag having been sealed to the tool base but not yet evacuated.

Referring now to FIG. 9, the container 26 protectively housing the wireless transmitter 28 may be disposed within a cavity 73 formed in a tool 74 on which the part layup 77 is placed. In the illustrated example, the compartment 73 is generally cylindrical in shape and supports a bottom wall 59 of the container housing 55. The top of the container 55 is covered by a circular plate 76 whose outer edges 76a are received within a notch 74a in the tool 74. The plate 76 may also rest on an upper edge 55f of the housing 55 which reacts against the pressure applied to the part layup 77 by the autoclave 22. Clamps (not shown) may be used to force the plate 76 against the housing edge 55f, however, in some applications, the pressure developed within the autoclave 22 may be sufficient to hold the plate 76 tightly against the housing edge 55f.

The sensor wire receptacle 64 may be mounted on the plate 76. In the illustrated embodiment, a pressure sensor 24a is placed on the tool 74, in close proximity to the container 26. The sensor 24a may be disposed beneath a vacuum bag 78 which covers the layup 76 and is sealed to the tool 74 by a seal 79. Other sensors (not shown) may be distributed inside, under, or over the layup 77 and connected with the transmitter 28. The transmitting antenna 30 may be mounted on the tool 74, outside of the vacuum bag 78, and a wire 67a connecting the antenna 30 to the transmitter 28 may be trained through a tunnel 75 formed in the tool 74.

Since the cavity 73 is positioned beneath the vacuum bag 78 in the illustrated example, a vacuum is maintained over the plate 76, and it may not be necessary to tightly seal the outer edges 76a of the plate 76 to the upper housing edge 55f, using an O-ring (not shown) or the like. Although the cavity 73 is shown as being located beneath the vacuum bag 78, it is possible that the cavity 73 may be located outside the area of the bag 78 but located on or within other areas of the tool 74 or a related tool base (not shown).

Figure 10:
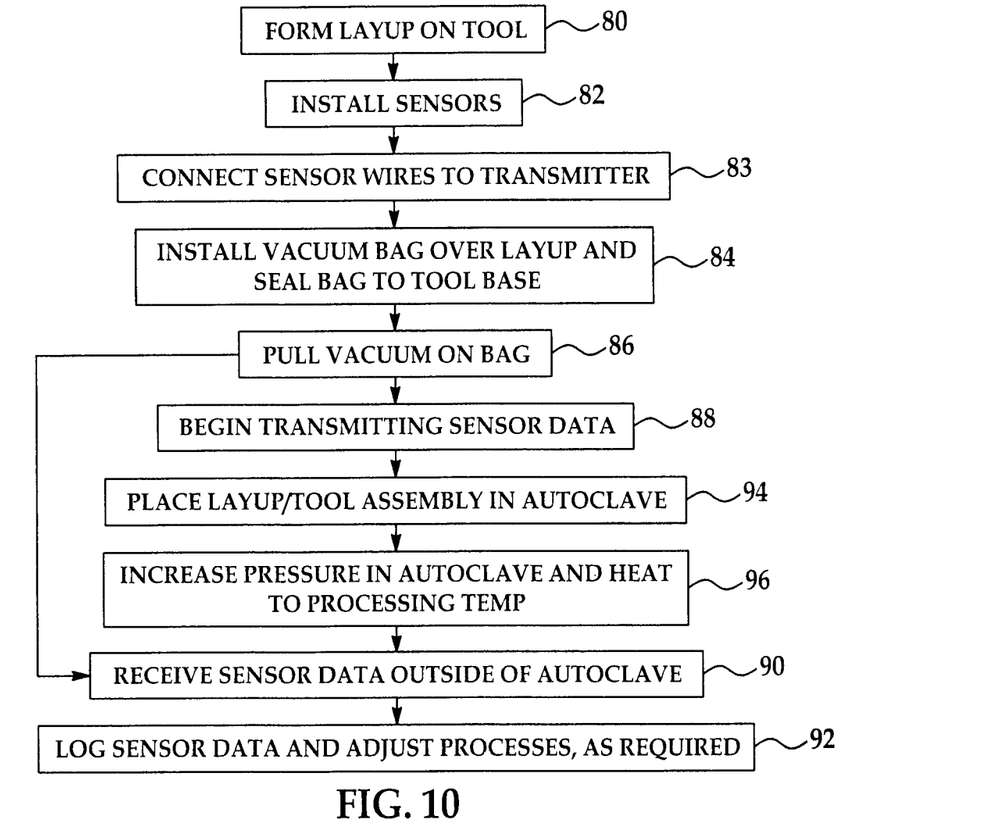
FIG. 10 is a flow diagram illustrating a method embodiment.

Attention is now directed to FIG. 10 which illustrates a flow diagram of a method embodiment. Beginning at step 80, a part layup 20a, 77 is formed on a suitable tool 38, 74. Next, at 82, pressure and/or temperature sensors 24, or other types of sensors 24 are installed. Alternatively however, the sensors 24 may be installed before or during the layup step 80. The sensors 24 may be connected the transmitter 28 as they are installed at 80, or they may be connected at a later time, after installation of the sensors 24 is complete, as shown at 83. A vacuum bag 78 is installed over the layup 20a, 77 and is sealed to the tool 38, 74 at step 84. A vacuum is then be pulled on the bag 78 at 86. The sensors 24 having been connected to the transmitter 28, it is then possible to begin transmitting sensor data as shown at step 88, even though the part layup 20a, 77 has not yet been placed in the autoclave 22. As shown at 90, the sensor data transmitted at step 88 is received by a receiver unit 32 outside the autoclave 22 and, at step 92 is subsequently logged and processes may be adjusted, as required.

At step 94, the part layup 20a, 77 along with the associated tooling 38, 74 are loaded into the autoclave 22. Autoclave vacuum lines (not shown) are hooked up to the bag 78, and vacuum is applied to the bag 78 using an autoclave vacuum system (not shown). Then, at step 96, the autoclave 22 is sealed, the integrity of the vacuum bag 78 is checked, pressure in the autoclave 22 is increased and the temperature is elevated, to begin processing of the part layup 20a, 77.

During the loading of the part layup 20a, 77 and start up of the autoclave 22, sensor data continues to be transmitted at 88 and received outside the autoclave 22 at step 90. Thus, the operator has continuous sensor data providing information, for example, about the pressure applied to various areas of the part layup 20a, 77 both before the layup is introduced into the autoclave 22 and during the entire autoclave process. The sensor data is logged and processes are adjusted, as required, at 92.

Figure 11:
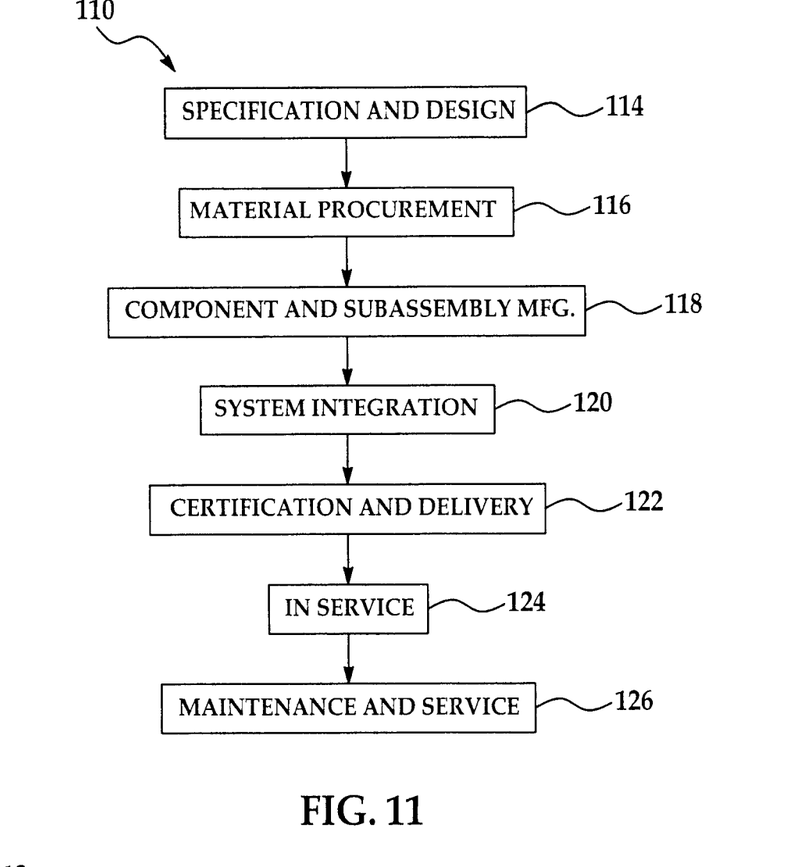
FIG. 11 is a flow diagram of aircraft production and service methodology.
Figure 12:
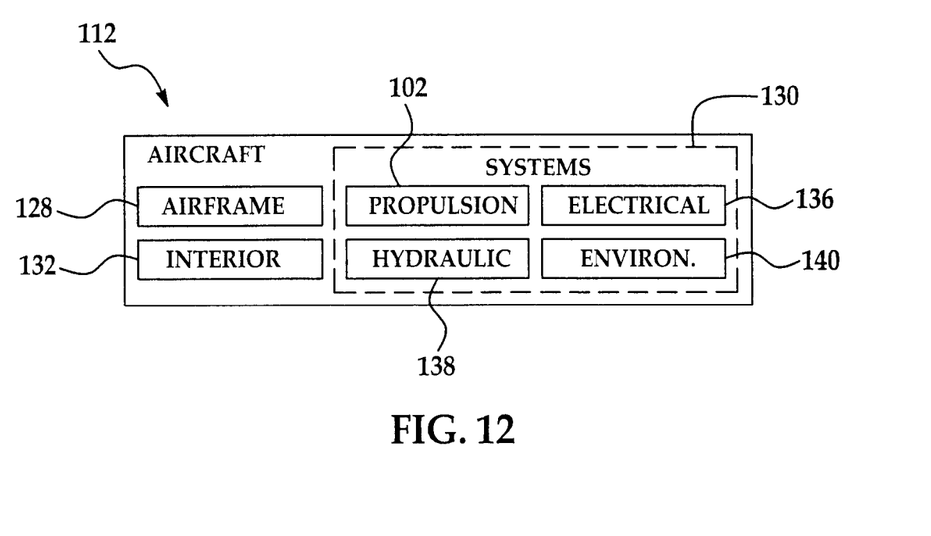
FIG. 12 is a block diagram of an aircraft.

Embodiments of the disclosure may find use in a variety of potential applications, particularly in the transportation industry, including for example, aerospace, marine and automotive applications. Thus, referring now to FIGS. 11 and 12, embodiments of the disclosure may be used in the context of an aircraft manufacturing and service method 110 as shown in FIG. 11 and an aircraft 112 as shown in FIG. 12. Aircraft applications of the disclosed embodiments may include, for example, without limitation, composite stiffened members such as fuselage skins, wing skins, control surfaces, hatches, floor panels, door panels, access panels and empennages, to name a few. During pre-production, exemplary method 110 may include specification and design 114 of the aircraft 112 and material procurement 116. During production, component and subassembly manufacturing 118 and system integration 120 of the aircraft 112 takes place. Thereafter, the aircraft 112 may go through certification and delivery 122 in order to be placed in service 124. While in service by a customer, the aircraft 112 is scheduled for routine maintenance and service 126 (which may also include modification, reconfiguration, refurbishment, and so on).

Each of the processes of method 110 may be performed or carried out by a system integrator, a third party, and/or an operator (e.g., a customer). For the purposes of this description, a system integrator may include without limitation any number of aircraft manufacturers and major-system subcontractors; a third party may include without limitation any number of vendors, subcontractors, and suppliers; and an operator may be an airline, leasing company, military entity, service organization, and so on.

As shown in FIG. 12, the aircraft 112 produced by exemplary method 110 may include an airframe 128 with a plurality of systems 130 and an interior 132. Examples of high-level systems 130 include one or more of a propulsion system 134, an electrical system 136, a hydraulic system 138, and an environmental system 140. Any number of other systems may be included. Although an aerospace example is shown, the principles of the disclosure may be applied to other industries, such as the marine and automotive industries.

Systems and methods embodied herein may be employed during any one or more of the stages of the production and service method 110. For example, components or subassemblies corresponding to production process 90 may be fabricated or manufactured in a manner similar to components or subassemblies produced while the aircraft 92 is in service. Also, one or more apparatus embodiments, method embodiments, or a combination thereof may be utilized during the production stages 118 and 120, for example, by substantially expediting assembly of or reducing the cost of an aircraft 112. Similarly, one or more of apparatus embodiments, method embodiments, or a combination thereof may be utilized while the aircraft 112 is in service, for example and without limitation, to maintenance, repair of composite structure, and service 126.

Although the embodiments of this disclosure have been described with respect to certain exemplary embodiments, it is to be understood that the specific embodiments are for purposes of illustration and not limitation, as other variations will occur to those of skill in the art.

What is claimed is:

1. A container configured to protect a wireless transmitter used in a high temperature, high pressure environment, comprising:
   a pressure tight housing for protecting the transmitter from the effects of pressure in the environment;
   a compartment inside the housing, configured to contain the transmitter, said compartment comprising a cover plate, said cover plate adapted to pass antenna and sensor wires through said plate while maintaining a pressure of said compartment; and,
   a thermal barrier within the housing and surrounding the compartment, said thermal barrier configured to protect the transmitter from the effects of heat in the environment, said thermal barrier comprising a heat sink spaced from the interior wall of said housing and adjacent said compartment to define a vacuum chamber surrounding said heat sink, said heat sink comprising a continuous solid and/or liquid thermal mass between said vacuum chamber and said compartment, said vacuum chamber fluidly isolated from said compartment such that different pressures are maintained in said vacuum chamber and said compartment, said container configured to maintain substantially atmospheric pressure in said compartment.

2. The container of claim 1, wherein the vacuum chamber is at least partially filled with a volume of thermal insulation.

3. The container of claim 1, wherein the vacuum chamber and the heat sink are each ring shaped in cross section and concentrically surround the compartment.

4. The container of claim 1, wherein the thermal mass comprises a material selected from the group consisting of:
   iron, water, and a metal alloy having a low melting point.

5. The container of claim 1, further comprising an antenna adapted to be connected to the transmitter and mounted on an exterior surface of the housing.

6. The container of claim 1 wherein said thermal mass comprises a phase change liquid in fluid communication with said vacuum chamber.

7. A container configured to protect an electronic device against the effects of external heat and pressure, comprising:
   an outer pressure tight housing;
   a compartment within the housing configured to contain the electronic device, said compartment comprising a cover plate, said cover plate adapted to pass antenna and sensor wires through said plate while maintaining a pressure of said compartment;

a vacuum chamber within the housing surrounding the compartment in which air is partially evacuated to thermally insulate the compartment; and, a heat sink surrounding the compartment and being disposed between the compartment and the vacuum chamber, said heat sink comprising a continuous thermal mass between said vacuum chamber and said compartment, said heat sink configured to absorb heat passing through the vacuum chamber;

wherein said heat sink is spaced from the interior wall of said housing to define the vacuum chamber surrounding said heat sink, said vacuum chamber fluidly isolated from said compartment such that different pressures are maintained in said vacuum chamber and said compartment, said container configured to maintain substantially atmospheric pressure in said compartment.

8. The container of claim 7, wherein the vacuum chamber and the heat sink are each generally circular in cross section.

9. The container of claim 7, wherein the heat sink includes a reservoir adapted to contain a quantity of water, and the container further comprises:

a passageway placing the reservoir in fluid communication with the vacuum chamber, and a fluid connection on the housing adapted to be connected with a source of reduced pressure to draw off water vapor in the vacuum chamber.

10. The container of claim 7, wherein the heat sink includes a phase change metal alloy containing Bi, Pb, and In.

11. The container of claim 7, wherein the heat sink includes iron.

12. The container of claim 7, further comprising an antenna adapted to be connected to a transmitter and mounted on an exterior surface of the pressure tight housing.

13. A system configured to collect data relating to a process performed within an autoclave, comprising:

at least one sensor inside the autoclave for sensing a parameter related to the process; a wireless transmitter connected with the sensor, said transmitter configured to transmit signals from inside the autoclave representing the sensed parameter;

a container disposed inside the autoclave, the container surrounding and protecting the transmitter against the effects of heat and pressure inside the autoclave, said container comprising:

a pressure tight housing;

a compartment inside the housing configured to contain the transmitter, said compartment covered by a plate, said plate adapted to pass antenna and sensor wires through said plate while maintaining a pressure of said compartment; and, a thermal barrier within the housing and surrounding the compartment, said thermal barrier configured to protect the transmitter from the effects of heat in the environment, said thermal barrier comprising a heat sink spaced from the interior wall of said housing and adjacent said compartment to define a vacuum chamber surrounding said heat sink, said heat sink comprising a continuous thermal mass between said vacuum chamber and said compartment, said vacuum chamber fluidly isolated from said compartment such that different pressures are maintained in said vacuum chamber and said compartment, said container configured to maintain substantially atmospheric pressure in said compartment; and a receiving antenna inside the autoclave, said antenna configured to receive the transmitted signals.

14. The system of claim 13, further comprising:

a wireless receiver outside of the autoclave and connected with the antenna, and a wire connection passing through the autoclave Re-connecting the receiving antenna with the receiver.

15. The system of claim 13, further comprising a data logger inside the container and connected with the transmitter, said data logger configured to log and store the sensed parameters.

16. The system of claim 13, further comprising:

a tool inside the autoclave used in the process, the tool having a cavity therein in which the container is disposed.

17. A system for collecting data during processing of a laminated composite layup in an autoclave, comprising:

a sensor inside the autoclave, said sensor configured to sense a parameter relating to the processing of the layup;

a wireless transmitter inside the autoclave and connected with the sensor, said transmitter configured to wirelessly transmitting signals representing the sensed parameter;

a container inside the autoclave, said container configured to protect the wireless transmitter against the effects of heat and pressure in the autoclave, the container including a compartment enclosing the wireless transmitter, said compartment comprising a cover plate, said cover plate adapted to pass antenna and sensor wires through said plate while maintaining a pressure of said compartment, a heat sink surrounding the compartment and an outer housing defining a vacuum chamber surrounding the heat sink, wherein said heat sink is spaced from the interior wall of said housing to define said vacuum chamber, said heat sink comprising a continuous thermal mass between said vacuum chamber and said compartment, said vacuum chamber fluidly isolated from said compartment such that different pressures are maintained in said vacuum chamber and said compartment, said container configured to maintain substantially atmospheric pressure in said compartment;

a transmitting antenna on the housing and connected with the wireless transmitter; a receiving antenna inside the autoclave;

a wireless receiver outside of the autoclave and connected with the receiving antenna for receiving the transmitted signals; and a system configured to process the signals received by the wireless receiver.

* * * * *